United States Patent [19]

Russ et al.

[11] 4,236,151
[45] Nov. 25, 1980

[54] DYNAMICALLY VARIABLE SCALING METHOD AND APPARATUS FOR SPECTRAL DISPLAYS

[75] Inventors: John C. Russ, Palatine; Robert Carey, Deerfield; Vinod K. Chopra, Vernon Hill, all of Ill.

[73] Assignee: North American Philips Corporation, New York, N.Y.

[21] Appl. No.: 897,051

[22] Filed: Apr. 17, 1978

[51] Int. Cl.³ .................................................. G06F 3/14
[52] U.S. Cl. ........................... 340/722; 324/71 CP; 324/121 R; 340/731; 340/741
[58] Field of Search ......................... 324/71 CP, 121; 340/324 A, 722, 731, 741

[56] References Cited

U.S. PATENT DOCUMENTS

| 3,204,144 | 8/1965 | Deavenport | 324/121 R |
| 4,021,117 | 5/1977 | Göhde et al. | 324/71 CP |
| 4,052,596 | 10/1977 | Vick | 324/71 CP |
| 4,139,903 | 2/1979 | Morrill, Jr. et al. | 364/900 |

Primary Examiner—Marshall M. Curtis
Attorney, Agent, or Firm—Thomas A. Briody; Robert T. Mayer; Paul R. Miller

[57] ABSTRACT

A method and apparatus for dynamic variable scaling of spectral data utilizing the full available display area. Circuitry is provided to accept an initial upper scale limit. As a displayed data peak exceeds the initial preset limit, the maximum full scale limit is recomputed and the scale adjusted to accommodate the new data peaks on the full display area, each recomputation using as an upper scale limit a value slightly higher than the greatest peak value encountered. The method and apparatus may be utilized to vary dynamically each axis of a data display.

3 Claims, 7 Drawing Figures

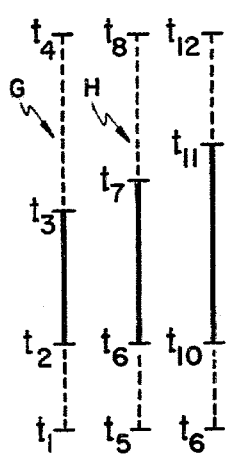
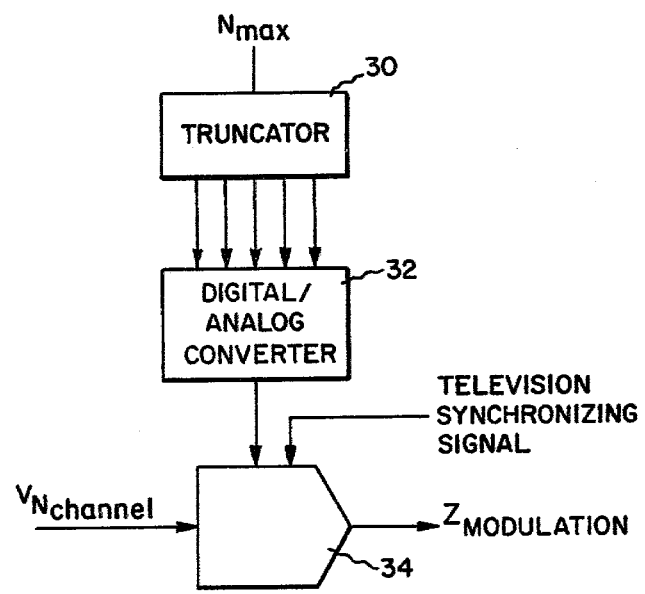
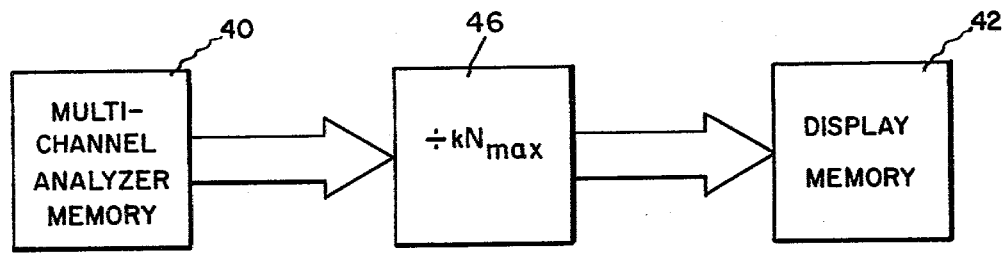
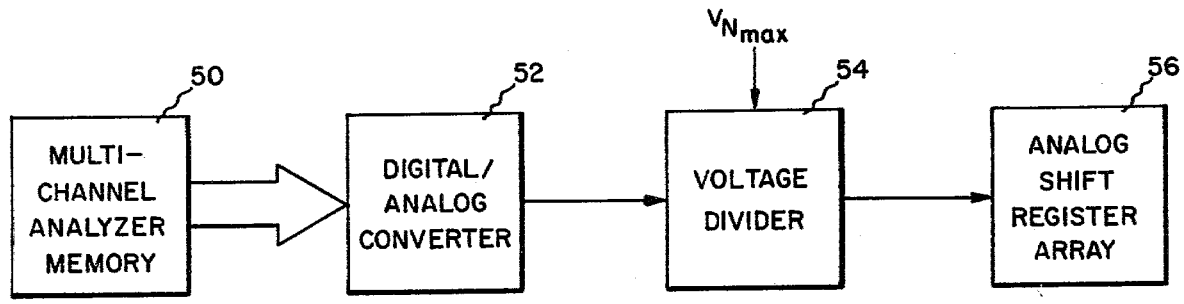

DYNAMICALLY VARIABLE SCALING METHOD AND APPARATUS FOR SPECTRAL DISPLAYS

CROSS REFERENCE TO RELATED APPLICATIONS

This application is related to U.S. Pat. application Ser. No. 897,052, filed simultaneously herewith on Apr. 17, 1978 entitled MULTICHANNEL ANALYZER, and owned by the same assignee.

BACKGROUND OF THE INVENTION

1. Field of the Invention

The present invention relates to a method of dynamically scaling displayed spectral information and the apparatus for performing such method.

2. Description of the Prior Art

In a number of applications, it is desirable to display spectral information, one such application being the visual readout of energy dispersive x-ray data. In such applications, it often occurs that information is being continuously provided to the display apparatus while the x-ray analysis is carried out. A common form of the display is a histogram-type visual read-out, in which a histogram or spectrum of the data is displayed on a cathode ray tube in one or more modes such as a television raster or a vector display, or on an x-y recorder. Additionally, the information may have been previously collected and stored on some memory media, e.g. a magnetic disc. In such situations, the displayed information reflects, in the vertical direction, the quantity of information that is stored or being stored, the parameter in the horizontal direction generally being a fixed physical unit, such as an energy, wavelength or other predetermined parameter.

If often happens that as the information is fed into the visual display apparatus, there is a dynamic situation, with the levels of the analytical data increasing at least in part, while the analysis is carried out, as a consequence of which, the vertical scale for the histogram readout usually has to be increased a number of times with the increasing levels of the analytical data.

In the prior art, such increases in the vertical scale of the readout are done statically, with the scale being changed intermittently by some predetermined factor of magnification or reduction, e.g. a doubling or a halving of the vertical scale, as explained hereinafter.

In one prior art mode of changing the vertical scale of the spectrum displayed, the approach is one of fixed vertical scaling of information, in which there is made, at the outset of or during the analysis, a selection or estimate of how many units there will be in the full vertical scale, after which the vertical scale is fixed, and the image then is scaled on the basis of the pre-selected value. It so happens that where, in fixed vertical scaling, there occur data whose upper limits exceed the predetermined fixed value, such that these data do not appear on the display, as a result of which, the information obtained might be significantly misleading or inadequate.

In another mode of displaying information, known to the art, sometimes referred to as "automatic vertical scaling", a minimum threshold value is assigned to the vertical scale and when any data peak in the spectrum, or histogram display reaches such threshold value, the vertical scale of the output display is increased, e.g. doubled, to accommodate such data peaks that exceed the pre-established threshold value. While this approach permits these higher data values to be registered, it suffers the disadvantage that the entire image is immediately shrunk to a fraction (i.e., to one-half where the vertical scale is doubled) of its previous image size in the vertical direction, such reduction, or halving, being continued in intermittent steps until the vertical values of these higher data values are reached. This type of digital-type adjustment, which is, in essence, a static adjustment of the vertical output scale, is not fully desirable because of the sudden decrease in the resolution of the displayed information, such decrease in resolution being particularly undesirable for relatively small values in the output information since these small values might no longer be accurately gauged and might even shrink to such small levels as not to be discernible. Such sudden decreases impair the readability of the display.

The present invention seeks to overcome or at least alleviate the disadvantages of the above prior art techniques and to provide further advantages as well.

SUMMARY OF THE INVENTION

This invention pertains to a method and apparatus for dynamic variable scaling of spectral data utilizing the full available display area. Circuitry is provided to accept an initial upper scale limit. As a data peak exceeds the initial preset limit, the maximum full scale limit is recomputed and the scale adjusted dynamically to accommodate the new data peaks on the full display area. Each recomputation uses as an upper scale limit a value slightly higher than the greatest peak value encountered, thus minimizing distortion of lower peak values during the dynamic scaling. The method and apparatus may be utilized to vary dynamically each axis of the data display. This dynamic scaling insures that all of the data are displayed and permits the relatively low values on the vertical range to be maintained for a period of time, thus enabling reading and comparison of these lower values for a larger projection of the examination time then is available with previously described prior art techniques. In the preferred embodiment the visible display uses a television display, either the vertical raster or the horizontal raster.

BRIEF DESCRIPTION OF THE DRAWINGS

FIG. 4 is a schematic depiction of a vertical television raster representing scan timing data.

FIG. 5 is a schematic representation of analog means for achieving a vertical television raster output spectrum.

FIG. 6 is a schematic representation of digital means for achieving horizontal television raster output spectrum.

FIG. 7 is a schematic representation of analog means according to another embodiment of the present invention, for achieving horizontal television raster.

DESCRIPTION OF THE PREFERRED EMBODIMENT

Figure 1:
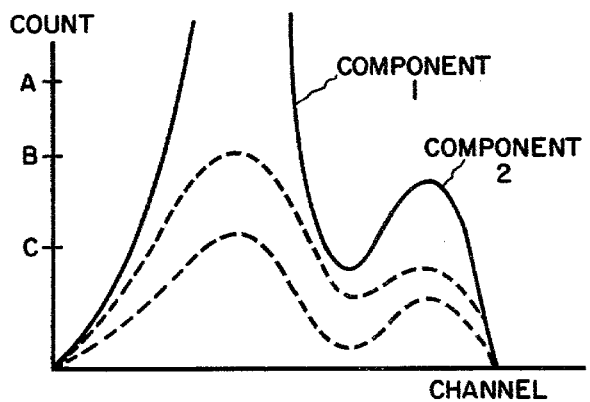
FIG. 1 is a graphic representation of an output display, or spectrum of analytical data achieved with prior art fixed vertical scaling, the peaks of the various components of such spectrum being integrated.

Referring to FIG. 1, which depicts the prior art mode of displaying a spectrum containing information generated by, for example, the x-ray fluorescence analysis of a sample material in which the vertical scale measures the intensity of the various elements of the material under analysis. This prior art mode is commonly referred to as the fixed vertical scaling mode. In such mode, the vertical scale is established at some predetermined level and the data are collected and fed into the display apparatus, it sometimes occurring that certain respective peaks of various components of the spectrum exceed this pre-established level and are not registered in the visual display.

More specifically, if the upper limit of the vertical scale is set at a value A (FIG. 1), and analytical x-ray fluoresence of a sample is carried out in a fashion familiar to the art, as the analysis is continued, information is continuously fed into the display device (e.g. a television display) as a result of which, at a certain time, the measure of the intensity of a constituent material of the sample is at level C and at a subsequent time, such intensity is at level B, with the intensity level thereafter reaching, and subsequently exceeding, level A. Consequently, the peak portion of the display component 1 (which can be the intensity of, e.g. iron in the sample) ends up off the display while the display component 2 (which can represent the intensity of e.g. nickel in the sample) remains fully within the display viewing field, this obviously being an undesirable result due to the inability to gauge the peak of component 1.

Figure 2:
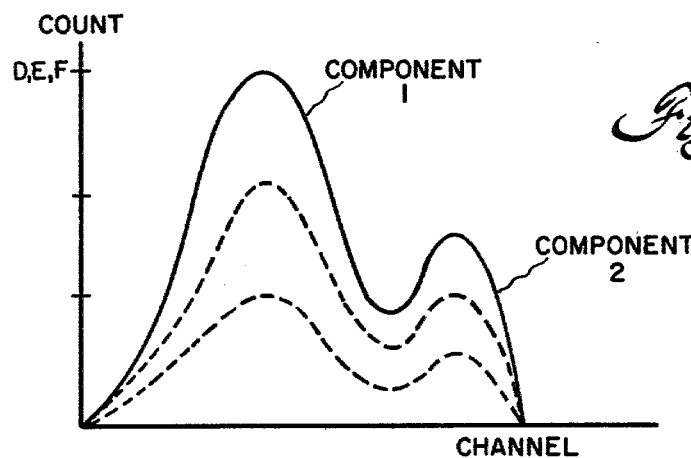
FIG. 2 is a graphic representation of an output display such as that in FIG. 1 except that this display is produced according to the present invention.

Referring to FIG. 2, according to the present invention, the upper limit of the range of the vertical scale is initially set at a pre-set fixed value and when this value is reached by the highest data point, the upper limit of the vertical scale range is then continuously maintained at a level that is at least equal to, and preferably exceeds somewhat, the highest peak value of the data, such that there is a dynamic adjustment of the upper limit of the vertical scale, thereby ensuring that all of the data are displayed and permitting the relatively low values on the vertical range to be maintained for a period of time and thus enabling reading and comparison of these lower values for a larger projection of the examination time than is available with the previously described prior art techniques. Specifically, as the intensity, i.e. the vertical scale reading of the highest peak of the data displayed, (i.e. the peak for display component corresponding to sample component 1) increases during the examination of the sample, the extent of the vertical range increases commensurately. As mentioned above, the visual display can be achieved with a television display, using either a vertical television raster (where the histogram lines are provided by the television scan line, i.e. the display comprises one or more vertical bars or lines).

Referring to FIG. 4, where the display is produced by a vertical television raster two successive lines G and H are shown with t designating the beginning of the scan for line G, $t_2$ designating the starting time of the histogram being produced, $t_3$ designating the stopping time of the histogram, and $t_4$ the start of the flyback. At $t_6$ the histogram H is begun to be written, with such writing stopping at $t_7$ and $t_8$ designating the start of the flyback. The starting times of the histograms, $t_2$, $t_6$, $t_{10}$ are always the same and the respective finishing times of the histograms $t_3$, $t_7$, $t_{11}$ being determined by the contents of the components or channels being displayed at those particular times.

Figure 3:
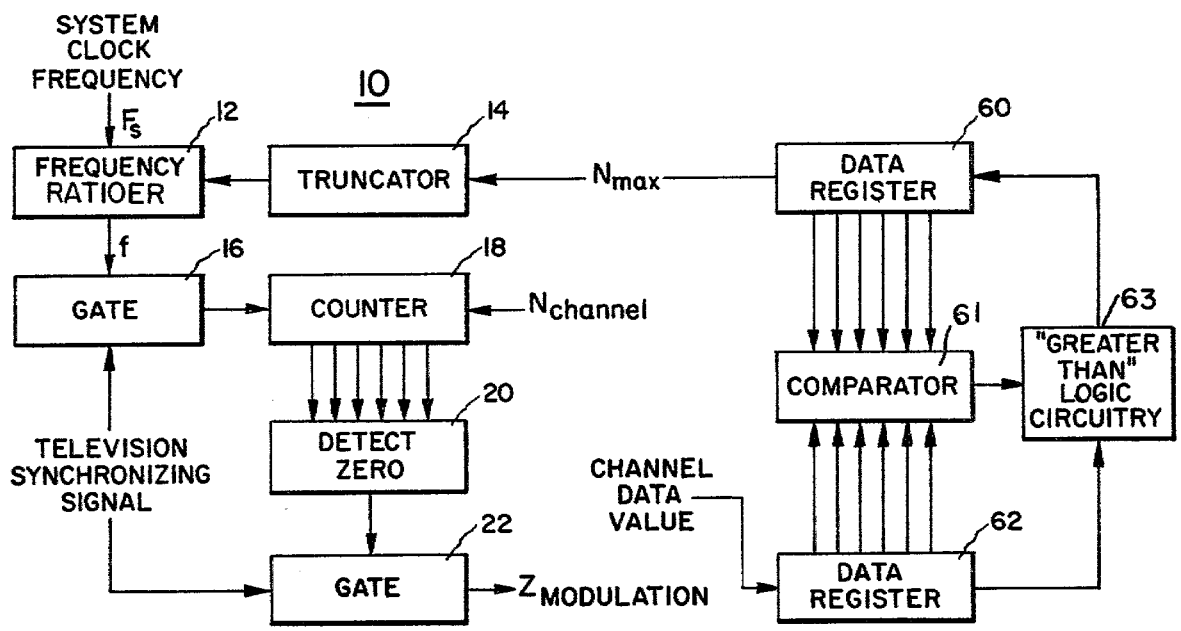
FIG. 3 is a schematic representation of digital means for carrying out the method of the present invention.

Referring to FIG. 3, there is shown a digital means for modulating the vertical television raster according to the present invention, where the upper range limit of the display is continuously maintained to equal or exceed somewhat the value of the highest peak of the information being collected. The means comprises an apparatus 10 to achieve a display of line G on the television display screen, the contents of a particular channel, N, are placed in a count-down counter whose content is monitored. At time $t_2$ the counter is counted down by a clock F and simultaneously the Z mode of the tube is brightened. When the contents of the counter are zero (at $t_3$) the brightness modulation is switched off. To ensure the correct operation, the following parameters are employed:

$$f = \frac{N \max}{T \text{ histogram}}$$

$$T \text{ bright} = \frac{N \text{ channel}}{N \max} \times T \text{ histogram}$$

$$= \frac{N \text{ channel}}{f}$$

$$T \text{ histogram} = T \text{ scan} \times k$$

where
- f is the clock frequency,
- N max is the vertical scale maximum value,
- T histogram is the time to display a line of maximum amplitude,
- T scan is the sweep or scan time of display (e.g. ty-$t_1$),
- T bright is the bright time (e.g. $t_3$-$t_2$),
- N channel is the content of the particular channel that is displayed, and
- k is the proportion of the total vertical sweep used for full vertical scale.

In accordance with the present invention, when a certain threshold value is exceeded by any channel of the display, the maximum full scale, Nmax, is constantly varied to follow the level or contents of the highest level channel. In this situation, there still applies the equation $$f = \frac{N \max}{T \text{ histogram}}$$

and, since T histogram is a constant, the frequency, f, is directly proportional to Nmax.

In the operation of digital means in FIG. 3 for a vertical television raster, the value Nmax of the highest level information channel is fed into a programmable frequency ratioing device 12 (ratioer) via truncator 14, which frequency ratioing device can be a digital differential analyzer, binary rate multiplier, or any other digital device available in the art. Device 12 serves to produce a frequency proportional to Nmax and inversely proportional to T histogram. While it is preferred that the value of N be truncated to reduce high frequency problems, this is not essential.

The threshold value for the count (vertical axis) is preset into a first data register 60. In the case of spectrum collection (i.e., dynamic data collection), each time an event occurs in any channel (horizontal axis), the count magnitude is fed into a second data register 62, this data then being compared with the threshold value stored in the first data register 60 by means of a digital comparator 61. Logic 63 then will cause the contents of second data register 62 to be shifted into the first data register 60, when the data value in the second data register 62 exceeds the value in the first data register 60. Thus, when the threshold value is exceeded, the last data value stored in the first data register 60 is the $N_{max}$ value. Generally, the value of $N_{max}$ at the end of the last television frame is fed into frequency ratioer 12 via truncator 14 and this value will be used to scale the following television frame. In the case of a spectrum which had been previously collected and stored, $N_{max}$ is generated using the same circuitry as FIG. 3, but then the channel data values are compared only once, that being when the memory is loaded from the storage.

A system clock frequency, $F_s$ is also fed into the frequency ratioer 12 (FIG. 3). The output frequency, f, from the frequency devide is then proportional to Nmax, such output frequency being fed. The output of gate 16 is used to count down the contents of counter 18, into which the vertical scale value, Nchannel has been preset. The contents of counter 18 are fed into detect zero means 20, whose output is fed into another gate 22. The television synchronizing signal is also fed into gate 22, the output of which provides Z modulation.

In the operation of the apparatus 10, the counter 18 is preset with an Nchannel value at time $t_1$, $t_5$, $t_9$, etc. (FIG. 4) or at least some time between $t_3$ and $t_6$, $t_7$ and $t_{10}$, etc. Then, at time $t_2$, $t_6$, $t_{10}$, gate 16 is opened by the television synchronizing pulse, causing the frequency, f (FIG. 3), to start counting down counter 18. Simultaneously, the television synchronizing pulse opens gate 22, allowing the output of the zero detection means to provide a Z modulation. When counter 18 is at zero value, this occurring at $t_3$, $t_7$, $t_{11}$, etc., the Z modulation will then automatically disappear since this is produced only when the zero detection means 20 output does not represent zero. Thus, in building up each TV frame, frequency ratioer 12 is loaded one per frame at the beginning of the frame and counter 18 is preset once per line.

To achieve vertical television raster modulation in the analog mode, according to the present invention (FIG. 5), the value Nmax is truncated by truncator 30 (where truncation is desired, same being preferred but not required) and is converted by digital-to-analog converter 32 into a D.C. voltage which is used as an initial condition in an analog integration circuit 34 whose input is a voltage corresponding to Nchannel, a television synchronizing signal being fed into the analog integration circuit 34. The output of the integrator 34 is logically clamped to produce a Z modulation signal.

The integrator run down is started at $t_2$, $t_6$, $t_{10}$, etc., by the television synchronizing pulse and reaches zero level at $t_3$, $t_7$, $t_{11}$, etc. This circuit is the analog equivalent of the circuit in FIG. 3.

To achieve horizontal television raster according to the present invention, where this is desired to be achieved by digital means, information is transferred from a multi-channel analyzer memory 40 (FIG. 6) to a display memory 42, the contents of each channel being divided by $kN_{max}$ by digital means 46, thus normalizing the value of each channel to a maximum vertical scale value of $N_{max}$. Such digital means can comprise a computer, microprocessor, or hardwire digital arithmetic circuitry.

Such horizontal television raster can be achieved by analog means according to a further embodiment of this invention, with a multi-channel analyzer memory 50 (FIG. 7), from which information is transferred to a digital-to-analog converter 52, from which converter 52 information is fed into a voltage divider 54, to which $V_{Nmax}$ is fed, the output of which voltage divider 54 is then transferred to the analog shift register array 56, with the output therefrom being fed to a display device.

We claim:

1. A method for the dynamic scaling of displayed information on a two-dimensional dynamic display comprising:
   providing a maximum signal value, Nmax, defining the upper data limit of one axis of said display;
   truncating said maximum signal value;
   a frequency divider receiving as inputs a system clock signal in the output of said truncator and producing an output as a frequency F;
   passing said frequency to a first gate and transmitting signals from said first gate to a counter means;
   providing channel signals to be monitored to said counter means;
   providing the output of said counter to a zero detection means; and
   providing the output of said zero detection means to a second gate means;
   providing a television synchronizing signal to said second gate means;
   providing a Z modulation signal from said second gate means until said second gate means is disenabled by the detection of a zero from said zero detect means.

2. An apparatus for dynamically scaling displayed information on a two-dimensional dynamic display with analog means to modulate the vertical scale comprising:
   means to preset an upper limit of the range of the scale of said display in the vertical axis; said means presetting a maximum vertical signal value Nmax;
   means to store inputed data to be displayed on the vertical axis of said display;
   means to compare the maximum vertical signal value Nmax, said stored data, with the preset limit of said display scale, said preset limit serving as a threshold value;
   logic means to reset said upper limit of said scale value when said stored data exceeds said maximum signal value threshold;
   means for producing a new maximum signal value Nmax to reset said upper limit;
   a signal truncating means;
   means to provide said updated maximum signal value to said signal truncating means;
   a system clock means;
   a digital-to-analog converter to convert the output of said truncator into a DC voltage;
   an analog integration circuit having as inputs a voltage corresponding to the signal N channel and a display synchronizing signal; and
   means to logically clamp the output of said integrator to produce a Z modulation signal for said display.

3. An apparatus for dynamically scaling displayed information on a two-dimensional dynamic display with digital means to modulate the vertical scale comprising:
   means to preset an upper limit of the range of the scale of said display in the vertical axis; said means presetting a maximum vertical signal value Nmax;
   means to store inputed data to be displayed on the vertical axis of said display;
   means to compare the maximum vertical signal value Nmax, said stored data, with the preset limit of said display scale, said preset limit serving as a threshold value;

logic means to reset said upper limit of said scale value when said stored data exceeds said maximum signal value threshold;

means for producing a new maximum signal value Nmax to reset said upper limit;

a signal truncating means;

means to provide said updated maximum signal value to said signal truncating means;

a system clock means;

a frequency divider receiving Nmax signals from said truncator and receiving a signal Fs from said system clock;

said frequency divider providing an output proportional to Nmax and inversely proportional to the sweep time of the display multiplied by the proportion of total vertical sweep time;

first gate means receiving a display synchronizing signal f from said frequency divider;

counter means for receiving said signal F from said frequency first gate means;

a television synchronizing signal supplied to said first gate means;

zero detect means for detecting when said counter counts down to zero;

and second gate means for receiving signals from said zero detect means, said gate means also receiving said display synchronizing signal, said second gate means providing an output signal modulating the Z modulation of said display device of said apparatus until said zero detect means detects a zero in said counter.

* * * * *